United States Patent
Weilguni (10) Patent No.: US 11,362,259 B2
(45) Date of Patent: Jun. 14, 2022

(54) CONTROL CIRCUIT AND METHOD FOR CONTROLLING A PIEZOELECTRIC TRANSFORMER

(71) Applicant: EPCOS AG, Munich (DE)

(72) Inventor: Michael Weilguni, Hagenberg (AT)

(73) Assignee: EPCOS AG, Munich (DE)

( * ) Notice: Subject to any disclaimer, the term of this patent is extended or adjusted under 35 U.S.C. 154(b) by 0 days.

(21) Appl. No.: 15/775,795

(22) PCT Filed: Nov. 11, 2016

(86) PCT No.: PCT/EP2016/077463
§ 371 (c)(1),
(2) Date: May 11, 2018

(87) PCT Pub. No.: WO2017/081272
PCT Pub. Date: May 18, 2017

(65) Prior Publication Data
US 2019/0198746 A1    Jun. 27, 2019

(30) Foreign Application Priority Data
Nov. 12, 2015 (DE) .......................... 102015119574.7

(51) Int. Cl.
*H01L 41/107* (2006.01)
*H05H 1/24* (2006.01)
*H03F 3/217* (2006.01)
*H01L 41/04* (2006.01)

(52) U.S. Cl.
CPC .......... *H01L 41/044* (2013.01); *H01L 41/107* (2013.01); *H03F 3/2176* (2013.01); *H05H 1/24* (2013.01)

(58) Field of Classification Search
CPC ....... H01L 41/107; H01L 41/044; H05H 1/24; H05H 1/2475; H05H 1/2481; H05H 1/46; H05H 1/466; H03F 3/2176; C23C 16/452; C23C 16/45508; C23C 16/50; G03G 15/0283; G03G 15/80; H01J 2237/332; H01J 37/32036; H01J 37/32449;
(Continued)

(56) References Cited

U.S. PATENT DOCUMENTS 5,866,968 A   2/1999 Meeh
5,923,542 A   7/1999 Sasaki et al.
(Continued)

FOREIGN PATENT DOCUMENTS

CN   100474755 C   4/2009
CN   101404462 A   4/2009
(Continued)

*Primary Examiner* — Alexander H Taningco
*Assistant Examiner* — Amy X Yang
(74) *Attorney, Agent, or Firm* — Slater Matsil, LLP (57) ABSTRACT

A control circuit and a method for controlling a piezoelectric transformer are disclosed. In an embodiment the control circuit includes an inductor and a control unit, wherein the control circuit is configured to apply a voltage with a periodic waveform to a piezoelectric transformer, wherein a period duration of the voltage is specified by a control frequency and adjust the control frequency of the applied voltage as a function of an average current intensity of a current flowing through the inductor.

17 Claims, 6 Drawing Sheets

(58) Field of Classification Search
CPC ........... H01J 37/32541; H01J 37/32733; H01J 37/32825; H02M 3/335
See application file for complete search history.

(56) References Cited

U.S. PATENT DOCUMENTS

| | | | |
|---|---|---|---|
| 6,016,052 A * | 1/2000 | Vaughn | H01L 41/044 323/355 |
| 6,268,681 B1 | 7/2001 | Yamaguchi et al. | |
| 6,738,267 B1 | 5/2004 | Navas Sabater et al. | |
| 6,885,172 B2 | 4/2005 | Danioni et al. | |
| 7,218,533 B2 | 5/2007 | Radecker et al. | |
| 7,294,972 B2 | 11/2007 | Chou et al. | |
| 8,431,274 B2 | 4/2013 | Watanabe et al. | |
| 8,639,133 B2 | 1/2014 | Nemoto | |
| 8,710,761 B2 | 4/2014 | Pauritsch et al. | |
| 9,705,064 B2 | 7/2017 | Kraxner et al. | |
| 9,788,404 B2 | 10/2017 | Nettesheim et al. | |
| 2002/0135271 A1 | 9/2002 | Takatsuka et al. | |
| 2004/0095020 A1 | 5/2004 | Kernahan et al. | |
| 2007/0013320 A1 | 1/2007 | Chou et al. | |
| 2009/0243431 A1* | 10/2009 | Ohsawa | F04B 43/046 310/317 |
| 2010/0104313 A1* | 4/2010 | Kosaka | G03G 15/1675 399/88 |
| 2010/0135698 A1* | 6/2010 | Nemoto | G03G 15/0283 399/168 |
| 2014/0334193 A1 | 11/2014 | Meyer et al. | |
| 2015/0303808 A1* | 10/2015 | Ryotaro | H02M 3/1588 323/271 |

FOREIGN PATENT DOCUMENTS

| | | |
|---|---|---|
| CN | 101494379 A | 7/2009 |
| CN | 102170231 A | 8/2011 |
| CN | 102420541 A | 4/2012 |
| CN | 104259081 A | 1/2015 |
| DE | 102008018827 A1 | 10/2009 |
| DE | 102013103159 A1 | 10/2014 |
| JP | S61220386 A | 9/1986 |
| JP | H09148645 A | 6/1997 |
| JP | 9252583 A | 9/1997 |
| JP | 3037903 B2 * | 5/2000 |
| JP | 3037903 B2 | 5/2000 |
| JP | 2000216450 A | 8/2000 |
| JP | 2002510882 A | 4/2002 |
| JP | 2010158149 A | 7/2010 |
| JP | 2011078159 A | 4/2011 |
| JP | 2016510483 A | 4/2016 |
| WO | 2010114040 A1 | 10/2010 |
| WO | 2014115050 A1 | 7/2014 |

* cited by examiner

CONTROL CIRCUIT AND METHOD FOR CONTROLLING A PIEZOELECTRIC TRANSFORMER

This patent application is a national phase filing under section 371 of PCT/EP2016/077463, filed Nov. 11, 2016, which claims the priority of German patent application 10 2015 119 574.7, filed Nov. 12, 2015, each of which is incorporated herein by reference in its entirety.

TECHNICAL FIELD

The present invention relates to a control circuit for a piezoelectric transformer and a method for controlling a piezoelectric transformer.

BACKGROUND

The control circuit may control/or regulate a piezoelectric transformer with respect to the frequency such that the transformer can reliably ignite a plasma. In order to enable a plasma ignition, the piezoelectric transformer should be controlled with a frequency that is at least close to its resonance frequency. Since the resonant frequency depends on many parameters, such as the power of the plasma generated by the piezoelectric transformer, the manufacturing tolerances, the process gas used and the ambient temperature, feedback is required, on the basis of which the control circuit can constantly adjust the frequency.

U.S. Pat. No. 5,923,542 A describes a control circuit for a piezoelectric transformer. Here, the output voltage or the output current of the piezoelectric transformer is used as a signal for the feedback. If, however, the piezoelectric transformer is to be used in a plasma generator, it is not possible to use signals from the output side, such as the output voltage or the output current, to provide the feedback, because it is at the output side of the piezoelectric transformer that the plasma is to be ignited.

Both U.S. Pat. No. 8,710,761 B2 and German Publication No. 102013103159 A1 disclose control circuits which obtain a feedback signal on the input side of a piezoelectric transformer. These use the phase relationship between the input voltage and the input current as a feedback signal, on the basis of which the control frequency is adjusted. The measurement of the phase involves a not inconsiderable amount of technical effort and therefore requires a complex measurement circuit.

SUMMARY OF THE INVENTION

Embodiments provide an improved control circuit as well as an improved method for controlling a piezoelectric transformer.

In various embodiments a control circuit is proposed, which is designed to apply a voltage having a periodic waveform to a piezoelectric transformer, the period of the voltage being specified by a control frequency, wherein the control circuit has an inductor and a control unit and the control unit is designed to adjust the control frequency of the applied voltage as a function of an average current intensity of a current flowing through the inductor.

Consequently, an average current intensity of the current flowing through the inductor may be designed to be used as a parameter for the feedback signal, on the basis of which the control circuit adjusts the control frequency with which the piezoelectric transformer is operated. The use of the average current has numerous advantages. Firstly, the average current can be monitored with a low number of components. For example, a shunt resistor, a current transformer or a Hall effect sensor can be used for measuring the average current. Accordingly, the control circuit comprises a very small number of components. Due to the low number of components, the space required for the control circuit is reduced. Accordingly, the control circuit is particularly suitable for applications with limited space, for example, in a plasma generator that can be used as a hand-held device.

The piezoelectric transformer can be a Rosen-type transformer. The piezoelectric transformer may be suitable for generating a non-thermal atmospheric pressure plasma.

The control unit can be designed to specify and adjust the control frequency with which the control circuit applies a periodic voltage signal to the piezoelectric transformer. For example, the control unit can activate a switch with a frequency, wherein the frequency with which the switch is activated specifies the control frequency.

The control circuit can have a class E amplifier, which comprises the inductor. In addition, the class E amplifier can comprise further components, such as the switch.

A class E amplifier is an amplifier in which a switching stage operates on an oscillator circuit, the voltage of which is applied to a load via a low-pass stage. The switching stage always closes when the oscillator circuit is passing through a zero crossing. The oscillator circuit can be an LC resonant circuit, which has an inductive element and a capacitive element. In the present control circuit, the class E amplifier can have an inductor, which forms the inductive element of the resonant circuit. The capacitive element of the oscillating circuit can be formed by the capacitance of the piezoelectric transformer, to which the class E amplifier is interconnected. The above-mentioned switching stage can be the switch of the class E amplifier.

The activation frequency can be adjusted in such a way that it lies between a resonance frequency and an anti-resonance frequency of the piezoelectric transformer. This allows the control circuit always to activate the switch when no voltage is applied to the piezoelectric transformer. This is referred to as zero voltage switching. Using zero voltage switching enables the losses to be reduced.

The resonant frequency and the anti-resonance frequency of the piezoelectric transformer depend on the plasma power currently being generated by the piezoelectric transformer. The control frequency can therefore be continuously adjusted in such a way that it always lies between the anti-resonance frequency and the resonance frequency. A control frequency can then be selected for operating the transformer, which is closer to the resonance frequency than to the anti-resonance frequency. Immediately after switching on the transformer, this can firstly be controlled with a control frequency which is closer to the anti-resonance frequency than to the resonant frequency. In particular, the power of the plasma generated by the transformer increases if the frequency at which the transformer is operated is reduced in the direction of the resonance frequency. In certain applications, a control frequency can also be selected which is not closer to the resonance frequency than the anti-resonance frequency, in order, for example, to set a low plasma power level.

The control unit can be designed to increase the control frequency when the average current intensity exceeds a first predetermined limit, wherein the control unit is designed to reduce the control frequency when the average current intensity falls below a second predetermined limit. It is thus possible to ensure that the average current intensity is always kept between the first and the second limit value.

This results in a stable behavior of the piezoelectric transformer operated by the control circuit.

Alternatively, the control unit can be designed to increase the control frequency when the average current intensity exceeds a predetermined target value and to reduce the control frequency when the average current intensity falls below the predetermined target value. Accordingly, the control circuit constantly tries to regulate the average current intensity to the predetermined target value. This gives rise to a stable behavior of the piezoelectric transformer.

The applied voltage can have a semi-sinusoidal waveform or a sinusoidal waveform. The sinusoidal waveform can be obtained, for example, using a control circuit in which two class E amplifiers are connected in a push-pull arrangement.

The control circuit can also comprise a measurement unit for measuring the average current through the inductor, which is connected in series with the inductor. The measurement unit can have, for example, a shunt resistor, a Hall sensor or a current transformer. A measurement of the average current can therefore be performed with simple components, so that overall only a small number of components is required to implement the circuit. As a result, the space required for the control circuit is reduced, which enables its use in hand-held devices.

The measurement unit for measuring the average current intensity may measure the current at intervals that are much larger than the period of the periodic signal. For example, the measurement unit should measure the average current intensity in periodic intervals that are at least ten times longer than the period of the periodic signal applied to the piezoelectric transformer.

This will enable the current intensity to be integrated over a specific measurement time so that the average current intensity can be determined. After each measurement of the average current intensity the control frequency can then be adjusted, should this prove necessary.

The control unit can comprise a microcontroller or a voltage controlled oscillator. Both allow an adjustment of the frequency with which a switch is activated.

The control circuit can have a switch, wherein the control unit is designed to activate the switch periodically, wherein the control frequency is specified by the duration of the period of the activation of the switch. The period duration in this case designates the time which elapses between two operations to switch on the switch. The activation of the switch can be either an opening or closing of the switch. The switch can be a switching transistor, in particular a MOSFET.

Further embodiments of the present invention relates to a plasma generator, which comprises the control circuit described above and a piezoelectric transformer. The piezoelectric transformer has two external electrodes, wherein the control circuit is designed to apply the voltage between the external electrodes of the piezoelectric transformer. The plasma generator is designed to generate a non-thermal atmospheric pressure plasma.

Other embodiments of the present invention relates to a method for controlling a piezoelectric transformer, wherein the piezoelectric transformer is connected to a control circuit which is designed to apply a voltage to the piezoelectric transformer and which has an inductor. The control circuit can be, in particular, the control circuit described above. Therefore, each functional or structural feature that has been disclosed in connection with the control circuit can also apply to the method.

The method comprises the following steps: —applying a voltage with a periodic waveform, the period duration of which is specified by a control frequency, to the piezoelectric transformer, —measuring an average current intensity of a current flowing through the inductor, and —regulating the control frequency as a function of the measured average current intensity.

Since the average current intensity through the inductance is directly related to the current intensity of an input current to the piezoelectric transformer, this parameter can be used to directly infer the plasma power generated by the piezoelectric transformer. As already explained above, this method also enables a control circuit with a small number of components to be used, so that this method is particularly suitable for hand-held devices.

In the step of applying a periodic voltage, a voltage can first be applied to the piezoelectric transformer with a control frequency which is below an anti-resonance frequency of the piezoelectric transformer, wherein the control frequency is incrementally reduced. Once the average current intensity of a current flowing through the inductor exceeds a predefined limit, the step of the incremental reduction of the control frequency is terminated. The process can therefore be started with a control frequency below, but close to the anti-resonant frequency, which corresponds to an initially high impedance of the piezoelectric transformer. The control frequency and hence the impedance of the transformer is then reduced in steps, until a desired plasma power level is set. A fine re-adjustment is then required.

To achieve this, during the step of regulating the control frequency the control frequency can be increased when the average current intensity exceeds a first predetermined limit and the control frequency can be reduced when the average current intensity falls below the predetermined limit.

Alternatively, during the step of regulating the control frequency, the control frequency can be increased when the average current intensity exceeds a predetermined target value and the control frequency can be reduced when the average current intensity falls below the predetermined target value.

BRIEF DESCRIPTION OF THE DRAWINGS

In the following the present invention will be described in more detail by reference to the attached figures.

DETAILED DESCRIPTION OF ILLUSTRATIVE EMBODIMENTS

Figure 1:
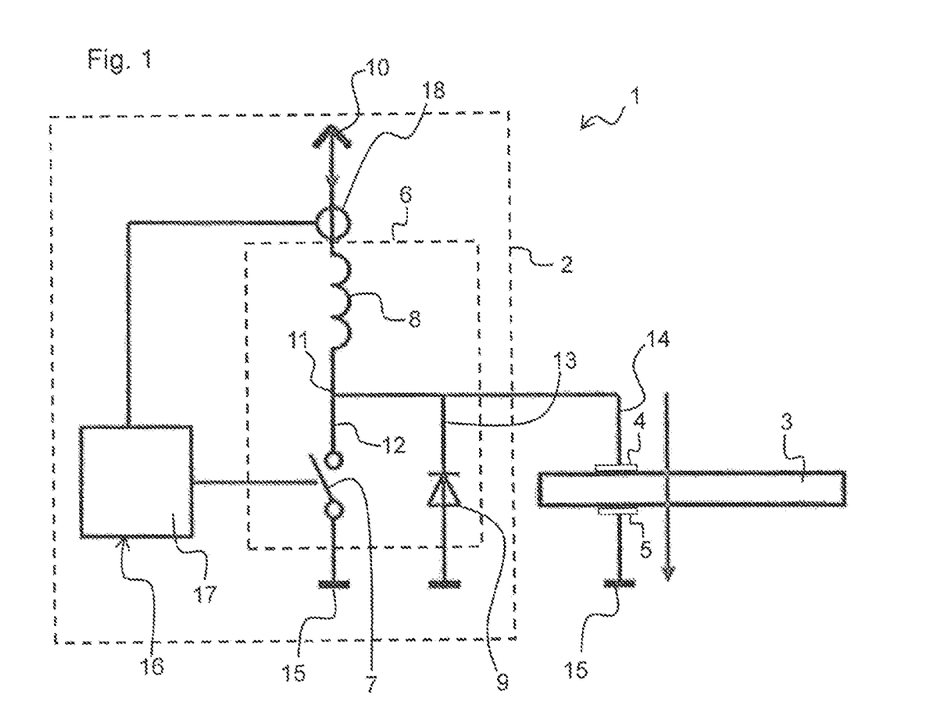
FIG. 1 shows a block circuit diagram of a plasma generator, comprising a control circuit and a piezoelectric transformer.

FIG. 1 shows a block circuit diagram of a plasma generator 1. The plasma generator 1 comprises a control circuit 2 and a piezoelectric transformer 3. The control circuit 2 is connected to a piezoelectric transformer 3 and enables a voltage to be applied to this.

The piezoelectric transformer 3 can be, for example, a Rosen-type transformer. The piezoelectric transformer 3 is suitable for generating a non-thermal atmospheric pressure plasma. The piezoelectric transformer 3 has an input area and an output area. The piezoelectric transformer 3 has a first external electrode 4 and a second external electrode 5, each of which is connected to internal electrodes in the input area. The control circuit 2 is designed to apply a voltage between the two external electrodes 4, 5 of the piezoelectric transformer 3.

If a periodic voltage is applied in the input area of the transformer 3, whose control frequency is sufficiently close to a resonance frequency of the piezoelectric transformer 3, then a high voltage is produced in the output area of the piezoelectric transformer 3, which is capable of ionizing a process gas, causing a plasma to be generated.

The control circuit 2 comprises a class E amplifier 6. The class E amplifier 6 comprises a switch 7 and an inductor 8. The switch 7 is a switching transistor, for example, a MOSFET. The class E amplifier 6 also comprises a diode 9.

In addition, the control circuit 2 comprises a voltage source 10, which supplies a DC voltage. The voltage source 10 is connected to the inductor 8. The voltage source 10 can be a battery, for example.

The inductor 8 is connected in series with a node point 11 of the control circuit 2, wherein the node point 11 is connected in series with other paths 12, 13, 14 of the control circuit 2. The switch 7 is arranged in a path 12. Via the switch 7, the node point 11 can be connected to a reference potential 15. The reference potential 15 can be a ground potential. If the switch 7 is closed, then the node point 11 is at the reference potential 15.

If the switch 7 is closed, a current flows from the voltage source 10 through the inductor 8 and the switch 7 to the reference potential 15. A magnetic field is thereby created in the inductance 8, causing energy to be stored. If the switch 7 is opened, no current can flow through the switch 7.

Another path 13 connected to the node 11 comprises the diode 9. The other path 13 connects the node point 11 to the reference potential 15 via the diode 9. The diode 9 in this case acts as a protective diode. In particular, the diode 9 is used to protect the switch 7. In particular, the diode 9 protects the switch 7 against damage in the event that the switch 7 is activated when the piezoelectric transformer 3 generates a large negative voltage between the first external electrode 4 and the second external electrode 5, for example, when the unit is switched on. In this case, zero voltage switching cannot yet be obtained.

A third path 14 connected to the node 11 is also connected to the first external electrode 4 of the piezoelectric transformer 3. The second external electrode 5 of the piezoelectric transformer 3 is connected to the reference potential 15.

If the switch 7 is closed, then the first external electrode 4 is at the reference potential 15. Accordingly, no voltage is applied between the two external electrodes 4, 5 of the piezoelectric transformer 3.

If the switch 7 is opened, then current no longer flows through the switch 7. Therefore, the magnetic field of the inductor 8 collapses. The current stored in the inductor 8 continues to flow through the third path 14 to the first external electrode 4 of the piezoelectric transformer 3. This causes a voltage to be built up between the first external electrode 4 and the second external electrode 5.

The control circuit 2 also comprises a control unit 16. The control unit 16 has a microcontroller 17, which is connected to the switch 7. The microcontroller 17 is designed to operate the switch 7, i.e., to open and close the switch 7. The microcontroller 17 can operate the switch 7 at periodic intervals, wherein the frequency with which the switch 7 is operated determines a control frequency. The control frequency corresponds to the frequency of the periodic voltage which is applied by the control circuit 2 to the piezoelectric transformer 3.

In addition, the control circuit 2 comprises a measurement unit 18 for measuring the average current through the inductor 8. The measurement unit 18 in the block circuit diagram shown in FIG. 1 is connected in series between the voltage source 10 and the inductor 8. Of course, the measurement unit 18 could also be arranged, for example, between the inductor 8 and the node point 11.

The measurement unit 18 in this case is a current transformer. The measurement unit 18 is connected to the control unit 16. A feedback signal which is forwarded via the measurement unit 18 to the control unit 16 indicates the average current intensity of the current through the inductor 8. Depending on the average current intensity, the control unit 16 can then set the control frequency of the switch 7.

Alternatively, the measurement unit 18 can determine the instantaneous current flowing through the inductor 8, and forward a corresponding signal to the control unit 16. From this the control unit 16 can determine the average current intensity, for example, by means of a calculation in a microcontroller.

Figure 2:
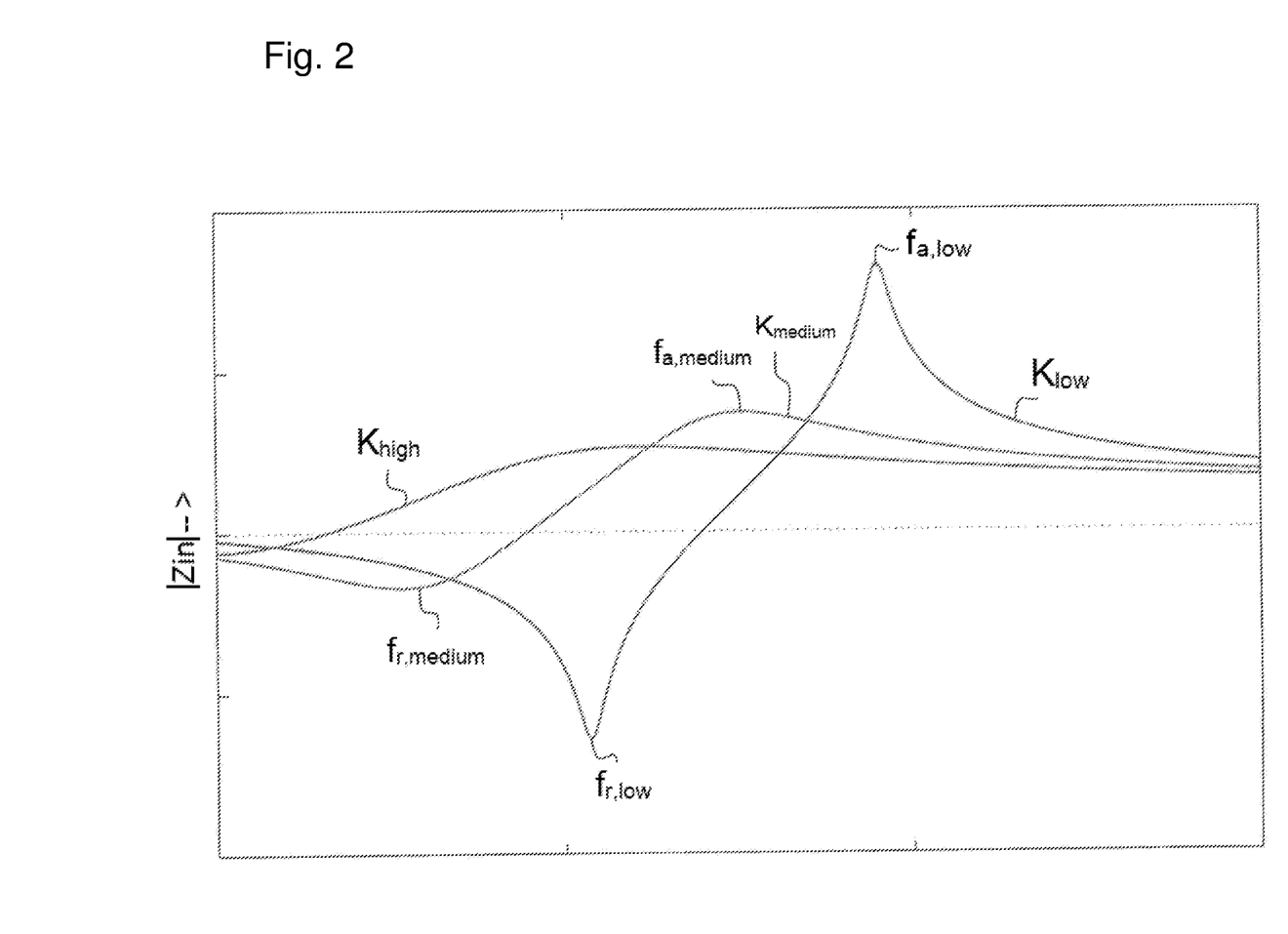
FIG. 2 shows the curve of the impedance of the piezoelectric transformer for different plasma power levels.

FIG. 2 shows the impedance behavior of the piezoelectric transformer 3. Here, the frequency of a periodic voltage applied to the piezoelectric transformer 3 is plotted on the abscissa axis. The ordinate axis indicates the value of the input impedance.

In FIG. 2 it is apparent that the impedance behavior is dependent on the plasma power generated by the piezoelectric transformer 3. The curve $K_{low}$ describes the impedance behavior of the piezoelectric transformer 3 for the case in which plasma is generated at the output side of the piezoelectric transformer 3 with a low power level. The curve $K_{low}$ shows a distinct resonance frequency $f_{r,low}$ at which the impedance has a minimum, and a distinct anti-resonance frequency $f_{a,low}$ at which the impedance has a maximum.

Also, the curve $K_{medium}$ describes the impedance behavior for the case where plasma is at the output side of the piezoelectric transformer 3 generated with a medium power level, wherein the terms medium and low power are to be understood, in particular, as being relative to each other. From the curve $K_{medium}$ it is apparent that the impedance behavior of the transformer 3 at medium power is flattened relative to the impedance behavior at low power. The minimum of the impedance at the resonant frequency $f_{r,medium}$ for medium plasma power has a higher value for the modulus of the input impedance than the minimum of the impedance at the resonant frequency $f_{r,low}$ for low plasma power. Furthermore, the maximum of the impedance at the anti-resonance frequency $f_{a,medium}$ for a medium plasma power has a lower value for the modulus of the input impedance than the maximum of the impedance at the anti-resonance frequency $f_{a,low}$ for low plasma power.

In addition, the resonant frequency and the anti-resonance frequency also decrease with increasing plasma power. Hence, in FIG. 2 it is apparent that the resonance frequency $f_{r,medium}$ for medium plasma power is lower than the resonance frequency $f_{r,low}$ for low plasma power and that the anti-resonance frequency $f_{a,medium}$ for medium plasma power is lower than the anti-resonance frequency $f_{a,low}$ for low plasma power.

The curve $K_{high}$ shows the impedance behavior for the case in which plasma is generated at the output side of the piezoelectric transformer 3 with high power, wherein the term high power is to be understood, in particular, as being relative to the above mentioned medium power and/or low power. From the curve $K_{high}$ it is apparent that with increasing plasma power the resonance frequency and the anti-resonance frequency of the piezoelectric transformer 3 both decrease, and that the impedance behavior then plateaus.

The plasma power of the piezoelectric transformer 3 depends in particular on the input power. If a current with a higher intensity is applied to the piezoelectric transformer 3, then the plasma power increases. Conversely, a reduction of the current intensity of the applied current leads to a lower plasma power.

The following describes how the control circuit 2 exploits the dependence of the impedance behavior of the piezoelectric transformer 3 on the plasma power, in order to bring about a self-stable behavior of the plasma generator 1 in which the shift in the resonance and anti-resonance frequency contribute to a stable regulation of the piezoelectric transformer 3.

For this purpose, the method with which the control circuit 2 operates the piezoelectric transformer 3 is described. After the plasma generator 1 is turned on the switch 7 is initially activated by the control unit 16 with a frequency which is below but close to the anti-resonance frequency of the piezoelectric transformer 3. This is based on the anti-resonance frequency that the piezoelectric transformer 3 has when no plasma is being generated.

Since the control frequency is close to the anti-resonance frequency, the piezoelectric transformer 3 here has a high impedance, so that initially no plasma is generated.

In the next method step the control frequency of the control circuit 2 is then incrementally reduced in the direction of the resonance frequency. In doing so, the impedance of the piezoelectric transformer 3 also reduces with each reduction of the control frequency. Since the impedance decreases and the input voltage on the piezoelectric transformer 3 remains constant, the input current increases. This cause the input power to increase. If the input power exceeds a specific value, a plasma is ignited at the output side of the piezoelectric transformer 3.

The lowering of the control frequency and the associated increase in the plasma power is also associated with a displacement of the impedance curve, as has already been discussed in connection with FIG. 2. In particular, the resonance frequency shifts towards a lower frequency. This ensures that, given a sufficiently small size for the steps by which the control frequency is reduced, the control frequency does not fall below the resonant frequency.

In addition, by means of the measurement unit 18 for measuring the average current through the inductor 8, the average current intensity of this current is constantly monitored. While the control frequency is being reduced incrementally, the average current intensity increases, because the impedance of the piezoelectric transformer 3 decreases. If the average current intensity then exceeds a first predefined limit, the control frequency is increased. In addition, a second predefined limit can be defined, which is less than the first predefined limit. If the average current intensity is less than the second predefined limit, then the control frequency is reduced.

In this way it can be ensured that the control frequency is always regulated in such a way that the average intensity of the current through the inductance 8 remains between the first and the second predefined limit. This allows the plasma power of the piezoelectric transformer 3 to be regulated to an almost constant behavior.

This method also enables the above-described flattening of the impedance curve with increasing plasma power to be exploited to induce a self-stable behavior of the plasma generator 1. If the plasma power becomes too great, the impedance increases near to the resonance frequency with increasing plasma power. As a result, the plasma power has an upper limit.

In an alternative design of the method, instead of the first and second predefined limit only one predefined target value is defined. If the average current intensity exceeds the predefined target value, the control frequency is increased. If the average current intensity falls below the predetermined target value, the control frequency is reduced. In this way an almost constant average current can always be set, which in turn leads to an almost constant plasma power of the piezoelectric transformer 3. This alternative method also uses the flattening of the impedance curve to induce a self-stable behavior of the piezoelectric transformer 3.

Figure 3:
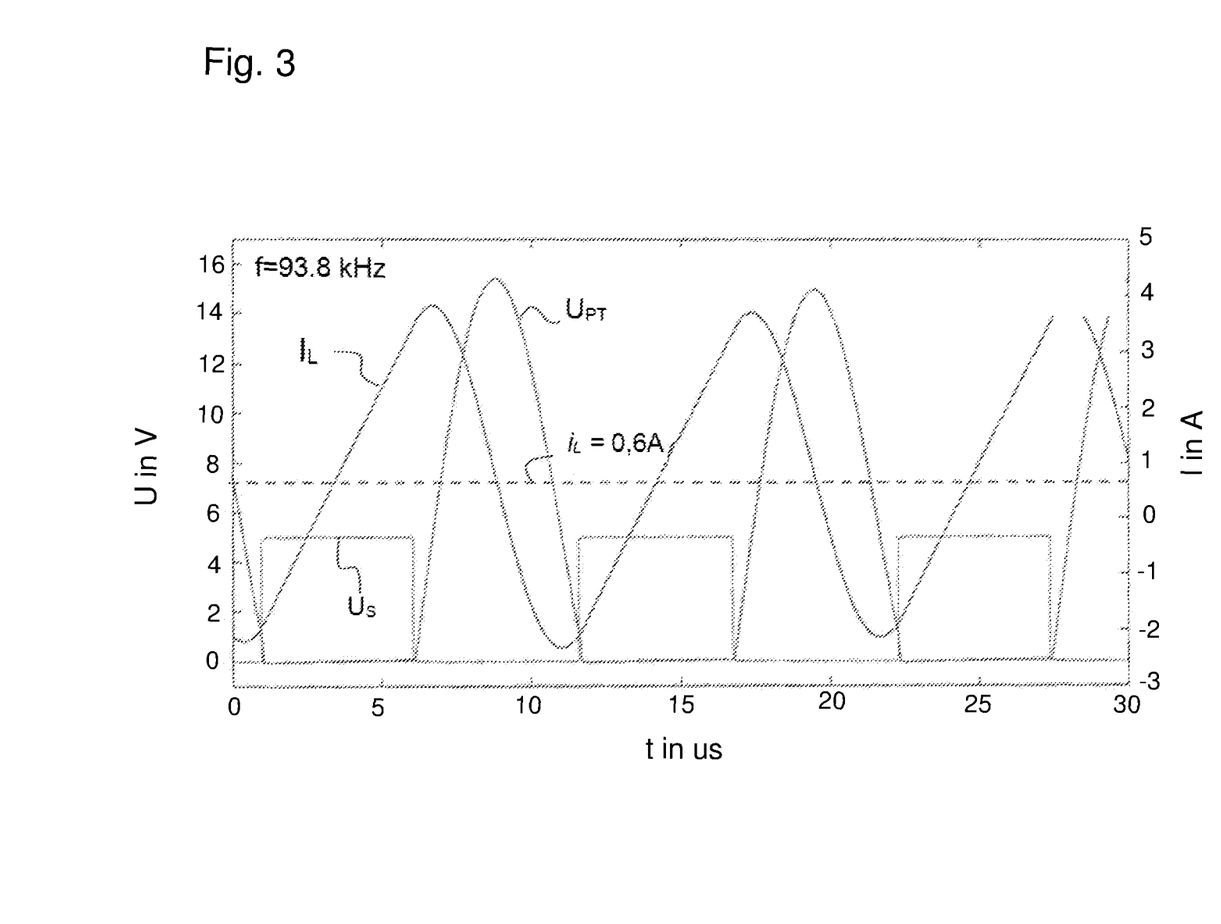
FIG. 3 and FIG. 4 each show the temporal waveform of a voltage applied to a switch, the current intensity through an inductor, and the voltage across the piezoelectric transformer for various frequencies and therefore different values of the average current intensity.

The behavior of the control circuit will be described in detail in conjunction with FIG. 3. FIG. 3 shows the temporal waveforms of the switching voltage applied to the switch 7, the current intensity through the inductor 8 and the voltage on the piezoelectric transformer 3, in each case for an average current of 0.6 A through the inductor 8.

In particular, the curve $U_S$ represents the temporal waveform of the switching voltage applied to the switch 7. In this graph the time in µs is plotted on the abscissa axis and the switching voltage V is plotted on the ordinate axis. If the switching voltage is 0V, then the switch 7 is open. If the switching voltage assumes a different value greater than 0V, then the switch 7 is closed. In the example examined here, the switch 7 is closed at a switching voltage of 5V.

FIG. 3 also shows that the switch 7 is opened and closed at periodic intervals. The frequency with which the switch 7 is activated is in this case 93.8 kHz. This frequency determines the control frequency of the piezoelectric transformer 3.

The curve $I_L$ represents the temporal waveform of the current intensity through the inductor 8. The time in µs is again plotted on the abscissa axis and the current intensity in A of the current through the inductor 8 is plotted on the ordinate axis.

If the switch 7 is closed, a current flows from the voltage source 10 through the inductor 8 to the reference potential 15. The current intensity of this current increases approximately linearly until the switch 7 is opened. The magnetic field generated by the inductor 8 is removed, due to the current continuing to flow through the piezoelectric transformer 3. The current intensity of this current increases almost linearly until the switch 7 is opened again.

FIG. 3 also shows the line $i_L$, which indicates the average value of the current intensity. In this case this value is 0.6 A. The control frequency of the switching 7 is always regulated such that the average value adjusts to this value.

The curve $U_{PT}$ represents the temporal waveform of the voltage applied to the piezoelectric transformer 3. Again, the time in µs is plotted on the abscissa axis and the voltage V is plotted on the ordinate axis.

If the switch 7 is closed, then no voltage is applied to the piezoelectric transformer 3. The two outer electrodes 4, 5 are connected to the reference potential 15. If the switch 7 is now opened, then due to the current that flows from the inductor 8 to the piezoelectric transformer 3, a voltage is formed between the two external electrodes 4, 5. Overall, this results in a semi-sinusoidal waveform of the voltage on the piezoelectric transformer 3. The semi-sinusoidal waveform has a frequency equal to the frequency with which the switch 7 is activated. This frequency is designated as the control frequency. The semi-sinusoidal waveform results from a resonant behavior of an input capacitance of the piezoelectric transformer 3 together with the inductance 8 and a resonant circuit which is formed in the piezoelectric transformer 3 itself.

By an appropriate choice of the inductance 8 and the control frequency, the semi-sinusoidal voltage on the piezoelectric transformer 3 becomes zero at the time when the switch 7 is closed. Therefore, the switching takes place when there is no voltage across the piezoelectric transformer 3. This type of switching is also known as zero voltage switching (ZVS). ZVS is possible for control frequencies that lie between the resonance frequency and the anti-resonance frequency of the piezoelectric transformer 3.

Figure 4:
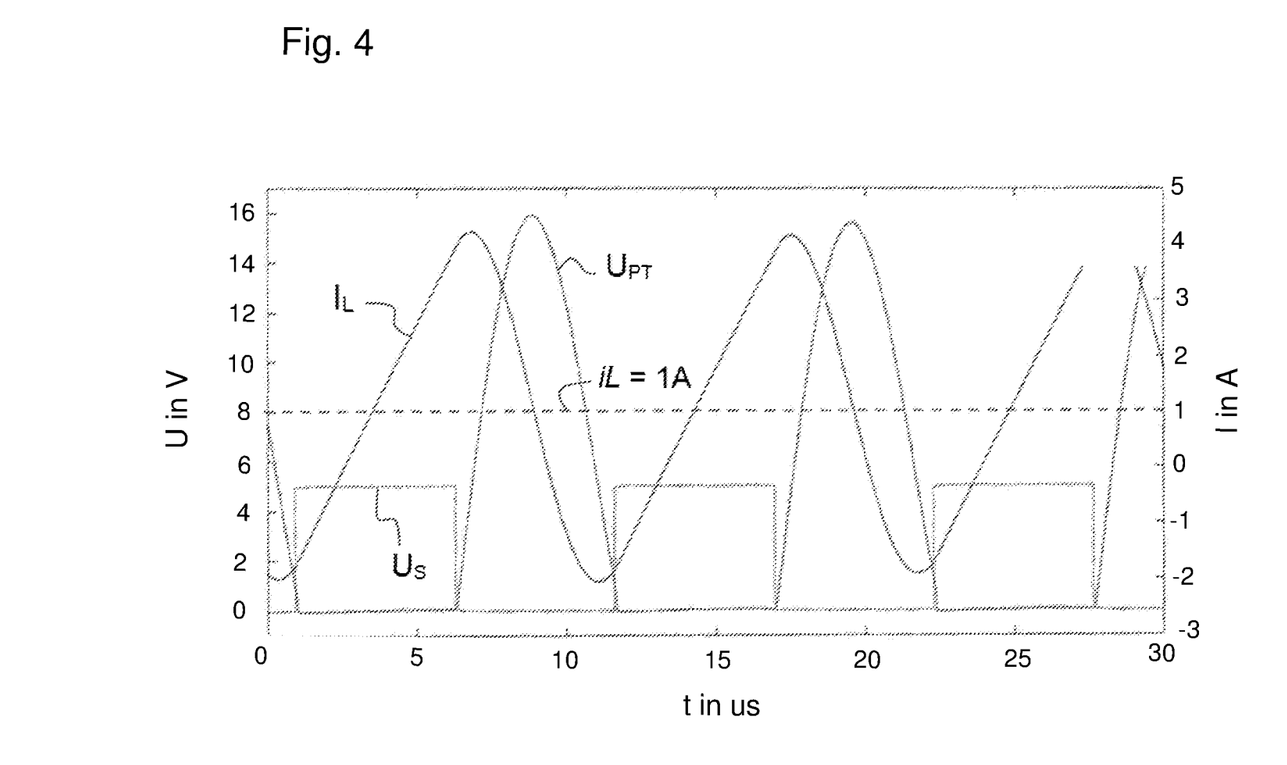

Depending on the control frequency, as explained in connection with FIG. 2, the impedance of the piezoelectric transformer 3 changes. The average current intensity of the current through the inductor 8 is also correlated with the control frequency. FIG. 4 shows the curves $U_S$, $I_L$, $U_{PT}$ shown in FIG. 3 for a regulation of the control circuit to an average current intensity of 1 A. This is obtained from a lower control frequency of 93.5 kHz.

Figure 5:
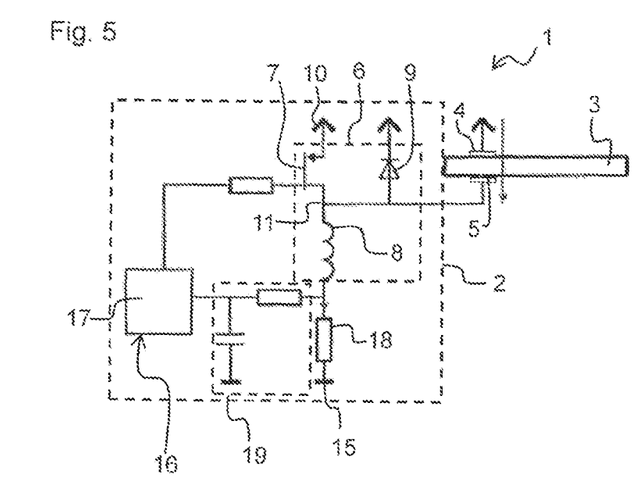
FIG. 5 shows a plasma generator with a control circuit according to a first exemplary embodiment.

FIG. 5 shows the circuit diagram of a plasma generator 1, which comprises the piezoelectric transformer 3 and a control circuit 2 according to a first exemplary embodiment. The design of the class E amplifier 6 is mirror-inverted with respect to the block circuit diagram shown in FIG. 1. The voltage source 10 is then directly connected to the switch 7. In particular, the voltage source 10 is connected to the source electrode of a switching transistor, which is used as the switch 7. The switching transistor 7 is a p-channel MOSFET.

For measuring the average intensity of the current flowing through the inductor 8 here a measurement unit 18 is used, which has a shunt resistance connected in series with the inductor 8. The shunt resistance is additionally connected to the reference potential 15. The control circuit 2 also comprises an RC low-pass filter 19, which is connected to the shunt resistor and is used to filter the current signal. Via the RC low-pass filter 19 a signal is passed to the control unit 16, the voltage of which is proportional to the average current intensity. The control unit 16 has a microcontroller 17, which can comprise an integrated analog-to-digital converter complete with reference voltage source, to evaluate the signal. Alternatively, the control unit 16 could have a comparator that compares the voltage signal with an external reference voltage.

The p-channel MOSFET which is used here as a switch 7, can be controlled by the control unit 16. Depending on the supply voltage, a gate driver may be required between the control unit and the p-channel MOSFET. The diode 9 shown in FIG. 5 can be an integrated body diode of the MOSFET. Alternatively, the diode 9 can be a discrete diode which is connected in parallel with the MOSFET.

Figure 6:
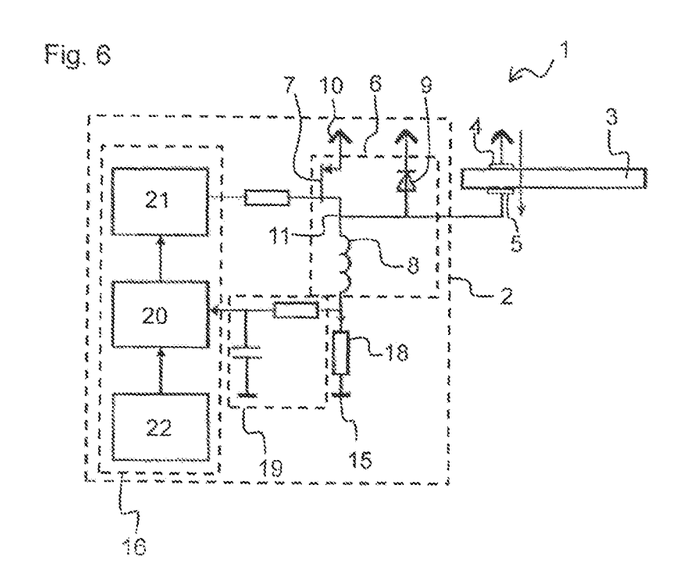
FIG. 6 shows a plasma generator with a control circuit according to a second exemplary embodiment.

FIG. 6 shows the circuit diagram of a plasma generator 1, which comprises the piezoelectric transformer 3 and a control circuit 2 according to a second exemplary embodiment.

In the control circuit 2 according to the second exemplary embodiment, instead of the microcontroller 17 the control unit 16 has a voltage controlled oscillator (VCO) 20, which defines the switching frequency for the switch 7. In addition, the control circuit 2 has a PI regulator (PI=proportional-integral) 21, which compares the average current intensity with a reference value and forwards a corresponding signal to the voltage controlled oscillator 20, by means of which the frequency of the voltage controlled oscillator 20 is adjusted. The reference value is provided by a reference voltage source 22.

Figure 7:
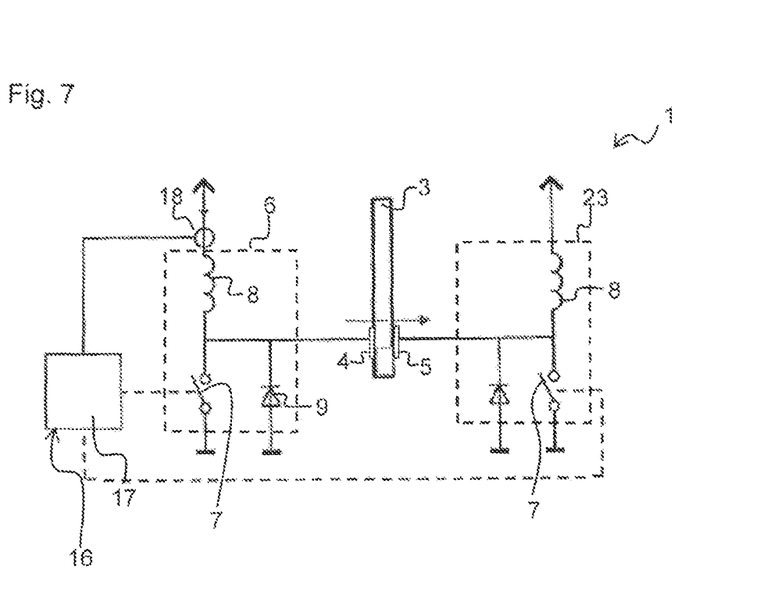
FIG. 7 shows a plasma generator with a control circuit according to a third exemplary embodiment.

FIG. 7 shows the circuit diagram of a plasma generator 1, which comprises the piezoelectric transformer 3 and a control circuit 2 according to a third exemplary embodiment.

The control circuit according to the third exemplary embodiment has a second class E amplifier 23. The class E amplifier 6 and the second class E amplifier 23 together form a push-pull amplifier. The second class E amplifier 23 comprises a switch 7 and an inductor 8. It enables the piezoelectric transformer 3 to be operated with a sinusoidal voltage. The two switches 7 are activated complementary to each other, so that one of the switches 7 is always open and one of the switches 7 is always closed. Here, also, a regulation of the control frequency is performed as a function of the average current intensity of the current through one of the inductors 8.

The third exemplary embodiment requires more components than the first two exemplary embodiments, but offers the advantage that the losses in the piezoelectric transformer 3 are lower.

As the control unit 16, in accordance with the third exemplary embodiment a microcontroller 17 or a voltage controlled oscillator 20 can be used.

The invention claimed is:

1. A control circuit comprising:
   an inductor;
   a measurement unit configured to measure an average current through the inductor; and
   a control unit configured to:
   apply a voltage with a periodic waveform to a piezoelectric transformer, wherein a period duration of the voltage is specified by a control frequency, and wherein applying the voltage with the periodic waveform comprises applying a voltage to the piezoelectric transformer with the control frequency, which is below an anti-resonance frequency of the piezoelectric transformer, and then incrementally reducing the control frequency until an average current intensity of a current flowing through the inductor exceeds a predetermined limit; and
   adjust the control frequency of the applied voltage as a function of the average current intensity of the current flowing through the inductor as previously measured by the measurement unit.

2. The control circuit according to claim 1, wherein the control frequency is set so that it lies between a resonance frequency and the anti-resonance frequency of the piezoelectric transformer.

3. The control circuit according to claim 1, wherein the control unit is configured to increase the control frequency when the average current intensity exceeds a first predetermined limit, and wherein the control unit is configured to reduce the control frequency when the average current intensity falls below a second predetermined limit.

4. The control circuit according to claim 1, wherein the control unit is configured to increase the control frequency when the average current intensity exceeds a predetermined target value, and wherein the control unit is configured to reduce the control frequency when the average current intensity falls below the predetermined target value.

5. The control circuit according to claim 1, wherein the applied voltage has a semi-sinusoidal waveform.

6. The control circuit according to claim 1, wherein the applied voltage has a sinusoidal waveform.

7. The control circuit according to claim 1, wherein the measurement unit is connected in series with the inductor, and wherein the measurement unit comprises a shunt resistor, a Hall sensor or a current transformer.

8. The control circuit according to claim 1, wherein the control unit comprises a microcontroller.

9. The control circuit according to claim 1, wherein the control unit comprises a voltage controlled oscillator.

10. The control circuit according to claim 1, wherein the control circuit has a switch, wherein the control unit is configured to activate the switch periodically, and wherein the control frequency is specified by a period duration of an activation of the switch.

11. The control circuit according to claim 1, wherein the control circuit has a class E amplifier, and wherein the class E amplifier comprises a switch and the inductor.

12. A plasma generator comprising:
the control circuit according to claim 1; and
the piezoelectric transformer, wherein the piezoelectric transformer has two external electrodes, and wherein the control circuit is configured to apply a voltage between the external electrodes of the piezoelectric transformer.

13. A method for controlling a piezoelectric transformer, the method comprising:
applying, by a control circuit, a voltage with a periodic waveform to the piezoelectric transformer, wherein a period duration of the periodic waveform is specified by a control frequency, and wherein the control circuit comprises an inductor;
measuring, by a measurement unit, an average current intensity of a current flowing through the inductor; and
regulating, by the control circuit, the control frequency as a function of the measured average current intensity as previously measured by the measurement unit,
wherein applying the voltage with the periodic waveform comprises applying a voltage to the piezoelectric transformer with the control frequency, which is below an anti-resonance frequency of the piezoelectric transformer, and then incrementally reducing the control frequency until the average current intensity of the current flowing through the inductor exceeds a predetermined limit.

14. The method according to claim 13, wherein regulating the control frequency comprises increasing the control frequency when the average current intensity exceeds a first predetermined limit and reducing the control frequency when the average current intensity falls below a second predetermined limit.

15. The method according to claim 13, wherein regulating the control frequency comprises increasing the control frequency when the average current intensity exceeds a predetermined target value and reducing the control frequency when the average current intensity falls below the predetermined target value.

16. A control circuit comprising:
an inductor;
a measurement unit configured to measure an average current through the inductor; and
a control unit configured to:
apply a voltage with a periodic waveform to a piezoelectric transformer, wherein a period duration of the voltage is specified by a control frequency, and
adjust the control frequency of the applied voltage as a function of an average current intensity of a current flowing through the inductor as previously measured by the measurement unit,
wherein the control unit is configured to increase the control frequency when the average current intensity exceeds a first predetermined limit, and
wherein the control unit is configured to reduce the control frequency when the average current intensity falls below a second predetermined limit.

17. A control circuit comprising:
an inductor;
a measurement unit configured to measure an average current through the inductor; and
a control unit configured to:
apply a voltage with a periodic waveform to a piezoelectric transformer, wherein a period duration of the voltage is specified by a control frequency, and
adjust the control frequency of the applied voltage as a function of an average current intensity of a current flowing through the inductor as previously measured by the measurement unit,
wherein the control unit is configured to increase the control frequency when the average current intensity exceeds a predetermined target value, and
wherein the control unit is configured to reduce the control frequency when the average current intensity falls below the predetermined target value.

* * * * *